(12) United States Patent
Gilchrist et al.

(10) Patent No.: US 10,193,066 B2
(45) Date of Patent: Jan. 29, 2019

(54) APPARATUS AND TECHNIQUES FOR ANISOTROPIC SUBSTRATE ETCHING

(71) Applicant: Varian Semiconductor Equipment Associates, Inc., Gloucester, MA (US)

(72) Inventors: Glen F. R. Gilchrist, Danvers, MA (US); Raees Pervaiz, Hampton, NH (US); Kenneth Starks, Gloucester, MA (US); Shurong Liang, Lynnfield, MA (US); Tyler Rockwell, Wakefield, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/639,029

(22) Filed: Jun. 30, 2017

(65) Prior Publication Data
US 2019/0006587 A1 Jan. 3, 2019

(51) Int. Cl.
| | |
|---|---|
| *H01L 21/3065* | (2006.01) |
| *H01L 21/3213* | (2006.01) |
| *H01J 37/32* | (2006.01) |
| *H01L 21/67* | (2006.01) |
| *H01L 45/00* | (2006.01) |

(52) U.S. Cl.
CPC .... *H01L 45/1675* (2013.01); *H01J 37/32422* (2013.01); *H01L 21/67069* (2013.01); *H01L 45/06* (2013.01); *H01L 45/1233* (2013.01); *H01J 37/32715* (2013.01); *H01J 37/32733* (2013.01); *H01J 2237/3341* (2013.01); *H01J 2237/3345* (2013.01); *H01L 45/144* (2013.01)

(58) Field of Classification Search
None
See application file for complete search history.

(56) References Cited

U.S. PATENT DOCUMENTS

| | | | | |
|---|---|---|---|---|
| 5,279,669 A | * | 1/1994 | Lee | B01J 19/126 |
| 8,288,741 B1 | | 10/2012 | Miller et al. | |
| 9,406,535 B2 | | 8/2016 | Berry, III et al. | |
| 2006/0231751 A1 | * | 10/2006 | Zuleta | H01J 49/0018 250/287 |
| 2013/0059449 A1 | | 3/2013 | Hautala et al. | |
| 2014/0234554 A1 | | 8/2014 | Radovanov et al. | |
| 2015/0011093 A1 | * | 1/2015 | Singh | H01J 37/32422 438/712 |
| 2015/0371827 A1 | | 12/2015 | Godet et al. | |
| 2016/0042975 A1 | * | 2/2016 | Ma | H01L 21/32136 438/720 |
| 2017/0062185 A1 | * | 3/2017 | Wallace | H01J 37/3244 |

* cited by examiner

*Primary Examiner* — Shamim Ahmed

(57) ABSTRACT

A method may include generating a plasma in a plasma chamber, the plasma comprising an etchant species and extracting a pulsed ion beam from the plasma chamber and directing the pulsed ion beam to a substrate, where the pulsed ion beam comprises an ON portion and an OFF portion. During the OFF portion the substrate may not be biased with respect to the plasma chamber, and the duration of the OFF portion may be less than a transit time of the etchant species from the plasma chamber to the substrate.

17 Claims, 4 Drawing Sheets

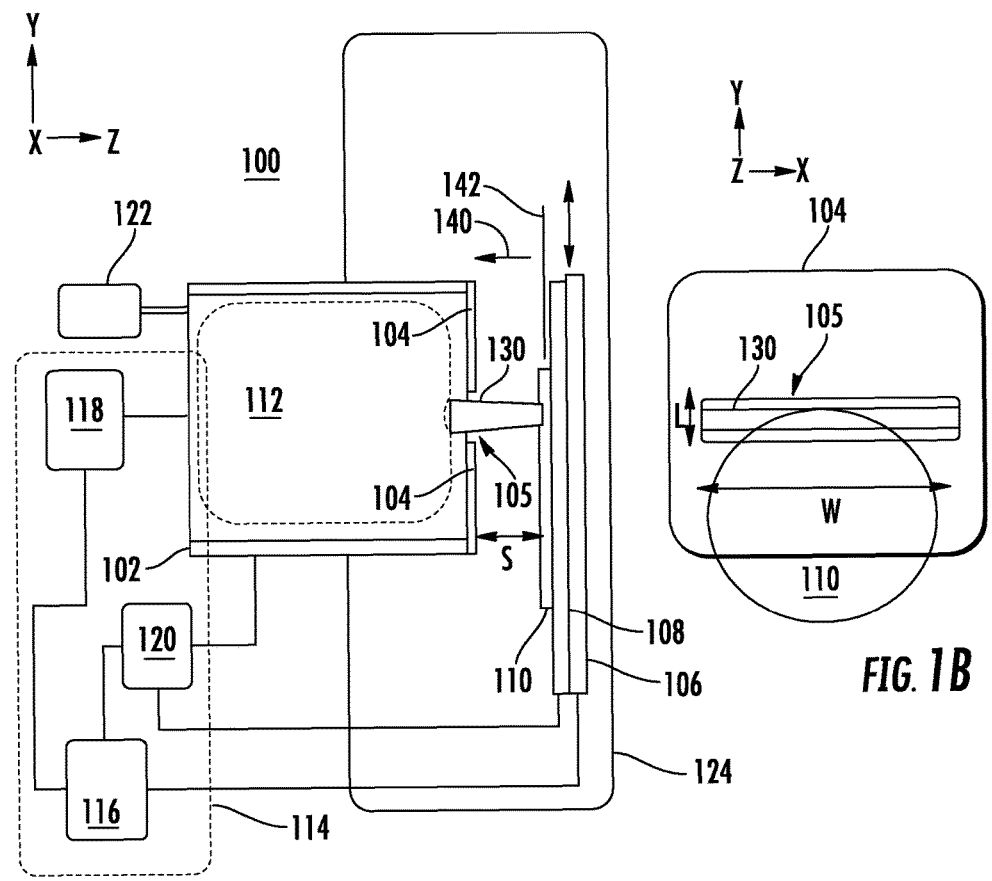
FIG. 1A
FIG. 1B
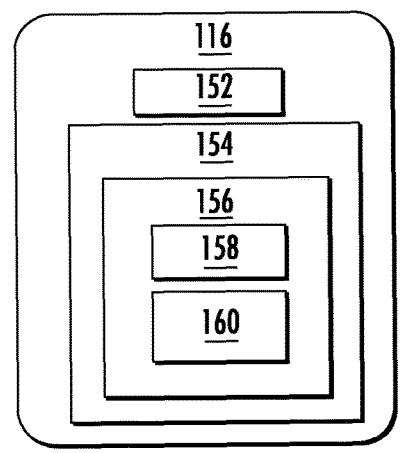
FIG. 2

APPARATUS AND TECHNIQUES FOR ANISOTROPIC SUBSTRATE ETCHING

FIELD

The present embodiments relate to device processing techniques, and more particularly, to processing for etching features in a substrate.

BACKGROUND

Fabrication of advanced device structures, such as three dimensional (3D) semiconductor structures with complex surface topology, high packing density and materials with finely tuned chemical compositions is replete with complex technical challenges. Reactive ion beam etching (RIBE), chemically assisted ion beam etching (CAIBE) and other plasma dry etching methods use a combination of energetic ions like $Ar^+$, $Cl^+$ and $CF_3^+$ and reactive neutrals species like radicals Cl, F, and $CF_3$ or excited state species like $Cl^*$ or $F^*$ to remove solid substrate material as volatile gas phase molecular species. In one example solid silicon, Si(s) may be converted into gas phase silicon tetrafluoride, $SiF_{4(g)}$ by reaction with a combination of fluorine ions, $F^+$, and fluorine atoms, F:

$$Si_{(s)} + F^+ + 3F \rightarrow SiF_{4(g)} \tag{1}$$

Process conditions in known plasma apparatus may be selected so that ions extracted from a plasma generate a generally anisotropic etch where trajectories of the ions may follow electric fields that extend to a substrate. As a result the trajectories of ions under certain conditions may be relatively uniform, such as vertical trajectories, with respect to a (horizontal) substrate surface. Reactive radicals generated in a plasma exhibit a random distribution of trajectories and angles of incidence at the wafer surface and etch patterned surfaces isotropically. Isotropic etching of a patterned surface may result in undercutting of the pattern hard mask, scalloping or horizontal etching of feature sidewalls, degradation of sidewall angle and chemical attack causing composition change in reactive solids like oxides, metals, semiconductors or alloys or such materials. Isotropic etching by radicals in known reactive ion etching processes may be much slower (>10×) than anisotropic ion-driven etching, enabling adequate pattern transfer from a mask to substrate. Remaining challenges in such processing include the unwanted process-induced damage and composition change commonly observed. Another challenge is to control radical flux at the substrate surface in order to reduce isotropic etching and process induced damage by radicals.

With respect to these and other considerations the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In another embodiment, a method may include generating a plasma in a plasma chamber, the plasma comprising an etchant species and extracting a pulsed ion beam from the plasma chamber and directing the pulsed ion beam to a substrate, where the pulsed ion beam comprises an ON portion and an OFF portion. During the OFF portion the substrate may not be biased with respect to the plasma chamber, and the duration of the OFF portion may be less than a transit time of the etchant species from the plasma chamber to the substrate.

In another embodiment a method of etching a substrate to form a surface feature, may include providing a chlorine-containing gas to a plasma chamber. The method may further include generating a plasma in a plasma chamber, where the plasma comprises an etchant species derived from the chlorine-containing gas. The method may also include extracting a pulsed ion beam from the plasma chamber and directing the pulsed ion beam to the substrate, where the pulsed ion beam includes an ON portion and an OFF portion. The method may also include pulsing a level of RF power of the plasma in concert with the pulsed ion beam, wherein the plasma comprises a first RF power level during the ON portion and a second RF power level during the OFF portion, wherein the first RF power level is higher than the second RF power level. The duration of the OFF portion may be less than a transit time of the etchant species from the plasma chamber to the substrate.

In another embodiment, a system may include a plasma chamber to generate a plasma, the plasma comprising an etchant species. The system may include an extraction plate, disposed along an edge of the plasma chamber, and a substrate stage configured to hold the substrate, and movable along a first direction so as to adjust a separation between the extraction plate and the substrate. The system may also include an extraction system to generate a pulsed extraction voltage between the plasma chamber and the substrate. The extraction system may include a controller and a memory unit coupled to the controller, including a control routine, where the control routine is operative on the controller to manage etching of the substrate. The control routine may include an input processor to determine a transit time of the etchant species; and a control processor to send at least one control signal to adjust at least one of a frequency of the pulsed extraction voltage, a duty cycle of the pulsed extraction voltage and the separation, based upon the transit time.

BRIEF DESCRIPTION OF THE DRAWINGS

FIG. 1A depicts an apparatus according to embodiments of the disclosure;

FIG. 1B depicts a plan view of a portion of the apparatus of FIG. 1A;

FIG. 2 depicts an exemplary controller;

DETAILED DESCRIPTION

Figure 3A:
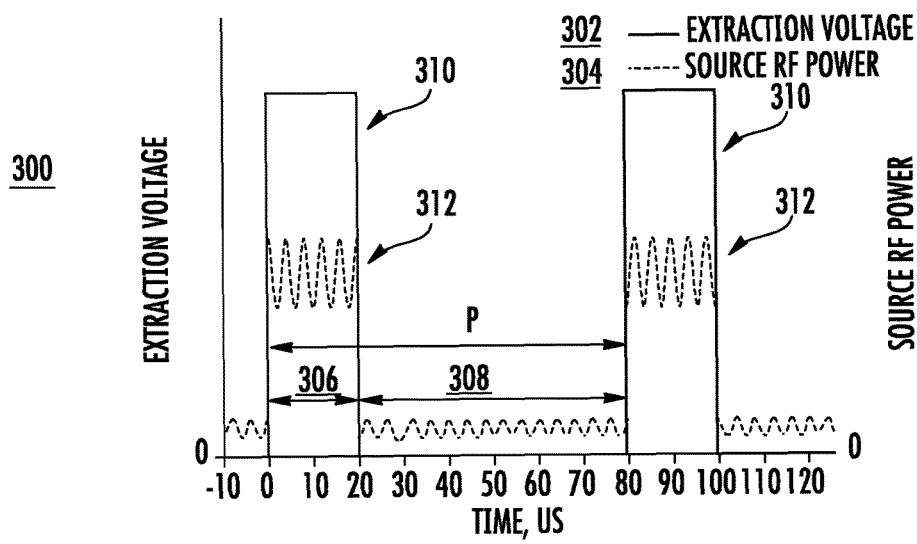
FIG. 3A and FIG. 3B depict exemplary waveforms generated by an extraction system arranged according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

This present embodiments provide novel techniques and apparatus to treat substrates, such as to etch a substrate, including a surface feature on a substrate. As used herein the term "substrate" may refer to an entity such as a semiconductor wafer, insulating wafer, ceramic, as well as any layers or structures disposed thereon. As such, a surface feature, layer, series of layers, or other entity may be deemed to be disposed on a substrate, where the substrate may represent a combination of structures, such as a silicon wafer, oxide layer, metal layer, and so forth.

In various embodiments, techniques and apparatus are disclosed that provide improved anisotropic etching using plasma-based processing. In accordance with various embodiments an apparatus and methods reduce the contribution of isotropic etchant species during pulsed ion beam processing of a substrate. The pulsed ion beam in particular may be generated from a plasma in a compact processing apparatus as detailed below.

FIG. 1A depicts an apparatus 100 according to embodiments of the disclosure. The apparatus 100 may be employed to perform etching of a substrate in various embodiments. The apparatus 100 may include various components that operate together as an apparatus providing novel and improved etching of a substrate 110. As illustrated, the apparatus 100 may include a plasma chamber 102 and process chamber 124, in fluid communication with the plasma chamber 102, via an extraction plate 104, also shown in plan view is FIG. 1B. A substrate stage 106 is disposed within the process chamber 124. The substrate stage 106 may be movable at along a direction parallel to the Y-axis, as well as along a direction parallel to the Z-axis in the Cartesian coordinate system shown. As such, the substrate stage 106 may scan the substrate 110, for example, with the aid of a platen 108, with respect to the plasma chamber 102.

The apparatus 100 further includes at least one reactive gas source, shown as the reactive gas source 122. The reactive gas source 122 may have a reactive gas outlet disposed within the process chamber 124. The reactive gas source 122 may be employed to deliver reactive gas to the plasma chamber 102 in some instances. For example, in one particular non-limiting embodiment, the reactive gas supplied by the reactive gas source 122 may comprise chlorine or a chlorine-containing material, while the substrate 110 comprises at least one material to be etched. In various embodiments, the substrate 110 may include at least one layer to be etched into a surface feature. The surface feature may be formed by providing a mask element so that etching takes place in regions of the substrate 110 not covered by the mask element. The surface feature may form part of a device, such as a memory device, logic device, or other device.

When reactive gas is delivered to the plasma chamber 102, a plasma 112 may be generated therein. In some embodiments, additional gas, such as inert gas, may be delivered to the plasma chamber 102. To generate a plasma 112, the apparatus 100 may include a plasma power supply 118, coupled to the plasma chamber 102.

The plasma 112 may be generated by coupling electric power from a plasma power supply 118 to gas supplied to the plasma chamber 102 through an adequate plasma exciter (not shown). As used herein the generic term "plasma source" may include a power generator, plasma exciter, plasma chamber, and the plasma itself. The plasma source may be an inductively-coupled plasma (ICP) source, toroidal coupled plasma source (TCP), capacitively coupled plasma (CCP) source, helicon source, electron cyclotron resonance (ECR) source, indirectly heated cathode (IHC) source, glow discharge source, or other plasma sources known to those skilled in the art. Therefore, depending on the nature of the plasma source the plasma power supply 118 may be an rf generator, a dc power supply, or a microwave generator, while plasma exciter may include rf antenna, ferrite coupler, plates, heated/cold cathodes, helicon antenna, or microwave launchers.

The apparatus 100 further may include a bias power supply 120 connected to the plasma chamber 102 or to a substrate stage 106, or to the plasma chamber 102 and substrate stage 106. The bias power supply 120 may optionally be connected directly to the process chamber 124 or to the substrate stage 106. Although not explicitly shown, the plasma chamber 102 may be electrically isolated from the process chamber 124. Extraction of a ion beam 130 comprising positive ions through the extraction plate 104 may accomplished by either elevating the plasma chamber 102 at positive potential and grounding the substrate stage 106 directly or via grounding the process chamber 124; or by grounding the plasma chamber 102 and applying negative potential on the substrate stage 106. The bias power supply 120 may operate in either a dc mode or pulsed mode having a variable frequency and duty cycle, or an AC mode.

The extraction plate 104 may be arranged generally according to known design to extract ions in the ion beam 130 in a manner that allows control of the ion angular distribution, i.e., the angle of incidence of the ion beam 130 with respect to a substrate 110 and the angular spread as detailed below. In particular embodiments, the extraction plate 104 and process conditions of the apparatus 100 may be used to generate the ion beam 130 as a beam of ions having mutually parallel trajectories. In particular instances, the trajectories may be aligned along a chosen direction, such as along a perpendicular 140 to a plane 142 of the substrate 110, where the plane 142 may be coincident with the X-Y plane, for example. In this manner, where the perpendicular 140 may lie along the Z-axis, the ion beam 130 may be used to etch features into the substrate 110 anisotropically along the Z-axis.

According to various embodiments, the ion beam 130 may be delivered to the substrate 110 in conjunction with neutral species, such as radicals, and may be delivered as a combination of neutrals, radicals and ions in some embodiments. As detailed below, in various embodiments, the bias power supply 120 may be operated in a pulsed DC mode in concert with the plasma power supply 118 to generate improved anisotropic etching of the substrate 110, as compared to known approaches. As further shown in FIG. 1A, the apparatus 100 may include a controller 116, where the controller 116 is coupled to the plasma power supply 118 and to the bias power supply 120 form an extraction system 114 that may harness properties of etchant species in the apparatus 100 in a manner that improves the degree of anisotropic etching of substrate 110. The controller 116 may also be coupled to the substrate stage 106, as shown.

As further shown in FIG. 2, the controller 116 may include a processor 152, such as a known microprocessor, dedicated processor chip, general purpose processor, or similar device. The controller 116 may further include a memory unit 154, coupled to the processor 152, where the memory unit 154 contains a control routine 156. The control routine 156 may be operative on the processor 152 to manage etching of the substrate 110, as detailed below. The control routine 156 may include an input processor 158, where input processor may be used to determine a transit time of etchant species used in the apparatus 100 to etch the substrate 110. The control routine 156 may further include a control processor 160 to send at least one control signal to adjust process parameters of the apparatus 100 based upon the transit time. Such process parameters may include the frequency of pulsed extraction voltage applied by the bias power supply 120, the duty cycle of the pulsed extraction voltage, or the separation S between substrate 110 and plasma chamber 102, or more precisely, the separation between substrate 110 and extraction plate 104.

In accordance with various embodiments, a plasma comprising etchant species, such as chlorine, in the form of chlorine neutrals or chlorine ions, for example, is generated in the plasma chamber 102. The ion beam 130 may be extracted by the extraction system 114 as a pulsed DC ion beam where a bias voltage is applied between the plasma chamber 102 and substrate as a series of DC voltage pulses, characterized by a frequency and a duty cycle, as in known apparatus. The frequency may vary from 1 kHz to 100 kHz pulsed DC, for example. The embodiments are not limited in this context. Additionally, an RF plasma in the plasma chamber 102 may be modulated by pulsing the plasma between different RF power levels, where RF pulses are synchronized to the DC voltage pulses. In this manner, an extraction recipe may be constructed to generate a series of extraction pulses, where the extraction pulses are characterized by OFF portions and ON portions. In a given ON portion, the absolute value of extraction voltage (DC bias voltage between plasma chamber and substrate) and the value of RF power applied to the plasma are relatively higher, while in the OFF portion the absolute value of extraction voltage and the value of RF power applied to the plasma are relatively lower. As detailed below, by controlling the duration of the ON portion, in conjunction with setting or adjusting the separation S, the degree of anisotropic etching of a substrate feature may be improved for a given species.

Turning now to FIG. 3A there are shown exemplary waveforms of an extraction recipe 300 that may be generated by the extraction system 114 according to embodiments of the disclosure. In particular embodiments, as shown in FIG. 3A, RF power that is supplied by the plasma power supply 118 may be synchronized to a dc waveform. In FIG. 3A, the waveform 302 represents extraction voltage, the voltage between plasma chamber 102 and substrate 110, shown as a function of time, while the waveform 304 represents RF power. As illustrated, the extraction voltage is provided in a series of extraction voltage pulses 310, with a pulse duration of 20 µs and a period of 80 µs.

In some embodiments, a peak value of extraction voltage may vary from approximately 200 V to 1500 V, while an OFF value is 0 V. The embodiments are not limited in this context.

At the same time, the RF power may be provided in a series of power pulses 312, where the power pulses 312 are synchronized with the extraction voltage pulses 310 to have the same duration, frequency, and to coincide in time with the extraction voltage pulses 310. For example, the RF power during the ON portion 306 may range from 600 W to 900 W. The embodiments are not limited in this context. In various embodiments, the RF power during the OFF portions 308 may range from 0 W to 400 W. The embodiments are not limited in this context.

Said differently, the extraction voltage pulses 310 take place during ON portions 306 of an extraction pulse that is characterized by a relatively higher extraction voltage and relatively higher RF power. The ON portions 306 are separated by OFF portions 308 of duration of 60 µs, yielding a total period P of 80 µs. The duty cycle of extraction voltage pulses 310, or duty cycle of ON portions 306 of an extraction pulse, is thus 20 µs/80 µs or 25%.

Figure 3B:
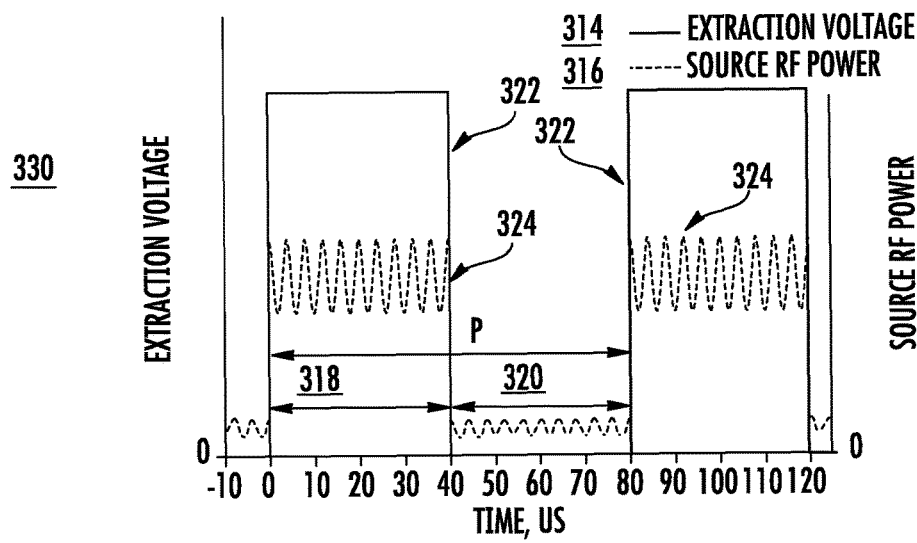

Turning now to FIG. 3B there are shown exemplary waveforms of an extraction recipe 330 that may be generated by the extraction system 114 according to embodiments of the disclosure. In particular embodiments, as shown in FIG. 3B, RF power that is supplied by the plasma power supply 118 may be synchronized to a dc waveform, as in FIG. 3A. In FIG. 3B, the waveform 314 in solid line represents extraction voltage, the voltage between plasma chamber 102 and substrate 110, shown as a function of time, while the waveform 316 in dashed line represents RF power. As illustrated, the extraction voltage is provided in a series of extraction voltage pulses 322, with a pulse duration of 40 µs and a period P of 80 µs. At the same time, the RF power may be provided in a series of power pulses 324, where the power pulses 324 are synchronized with the extraction voltage pulses 322 to have the same duration, frequency, and to coincide in time with the extraction voltage pulses 310. Said differently, the extraction voltage pulses 322 take place during ON portions 318 of an extraction pulse that is characterized by a relatively higher extraction voltage and relatively higher RF power. The ON portions 318 are separated by OFF portions 320 of duration of 40 µs, yielding a total period of P of 80 µs, as in FIG. 3A. The duty cycle of extraction voltage pulses 322, or duty cycle of ON portions 318, is thus 40 µs/80 µs or 50%.

According to various embodiments the degree of isotropic etching of a substrate feature may be reduced by arranging an extraction recipe to reduce the relative amount of exposure of a substrate to isotropic etching as opposed to anisotropic etching. The extraction recipe may include an extraction voltage value for a pulsed ion beam, as well as a duration of an OFF portion of an extraction pulse, a separation S between substrate and plasma chamber, and other parameters. The example of FIGS. 3A and 3B provides one illustration of a parameter, duty cycle, where the duty cycle may be adjusted so as to adjust the duration of an OFF portion. As detailed below, by adjusting this duration, the contribution of isotropic etchants to an etch process may be reduced.

By way of explanation, during a period where plasma is extinguished or plasma power is reduced, such as an OFF portion of an extraction pulse, as defined above, including a plasma afterglow period, the molecular dissociation and radical flux are reduced as plasma power is reduced. At the same time, during the afterglow period after plasma power is reduced or extinguished, together with the extinguishing of the extraction voltage, while no high energy ions are extracted, radicals and low energy ions may exit the plasma chamber, via an extraction aperture 105, and may impinge on a substrate. As detailed below, the present inventors have appreciated that the isotropic etching of radicals and low energy ions may be reduced by decreasing an OFF portion of an extraction recipe or increasing transit time of isotropic etchants such as radicals and low energy ions.

In various embodiments, by reducing RF power in concert with turning off extraction voltage during an OFF portion of a pulsed ion beam treatment, radical flux exiting a plasma is reduced as compared with the amount of radical flux when RF power is operated at higher power during an ON portion. By further adjusting processing conditions such as decreasing the duration of the OFF portion or increasing the transit time for radicals to travel from a plasma chamber to the substrate, the number of radicals that arrive at the substrate and etch the substrate isotropically during the off-pulse may be further reduced. In different embodiments duration of an OFF portion may be changed by changing pulse frequency or duty cycle, or a combination of pulse frequency and duty cycle, while the transit time may be increased by increasing the distance between the separation S between plasma chamber and substrate. Notably, the decrease in radicals (as well as low energy (≤1 eV) ions) during the early afterglow of an OFF portion may decrease isotropic etching of a substrate feature being etched, as well as decrease process-induced composition change for any highly reactive materials in the substrate feature.

When etching is performed using a pulsed ion beam treatment where transit time of a given etchant species exceeds the duration of an OFF portion between extraction pulses, the etchant species will not arrive at the substrate during the OFF portion and therefore may cause minimal isotropic etching and device damage. Such etchant species may include neutrals, such as radicals, as well as low energy ions. In many plasmas the population of neutrals may exceed the population of low energy ions during an OFF portion by a factor of 10 to 1000 times. Accordingly, isotropic etching during an OFF portion of a pulsed ion beam may be dominated by neutrals such as radicals. With this factor in mind, in some embodiments, the transit time of designated neutral etchant species is arranged to exceed the duration of an OFF portion of a pulsed ion beam used to etch a substrate. Table I. illustrates transit times for thermal neutrals that may be formed in a chlorine plasma, including Cl and $Cl_2$, shown as $t_{Cl}$ and $t_{Cl2}$. Table I includes different entries for different temperature neutrals, where estimates place the majority of thermal neutrals spanning a temperature range of 300 K to 900 K for a plasma power in the range of 300 W to 900 W. There are additionally different entries shown for different spacings S between the plasma chamber and substrate (shown as "z-gap") in Table I.

TABLE I

| | Transit Time for Thermal Neutrals | | | | Off Pulse | | |
|---|---|---|---|---|---|---|---|
| T, K | distance from aperture, z gap, mm (S) | | tCl, us | tCl2, us | Pulse f, kHz | Duty Cycle, % | Off Portion Duration t, us |
| 300 | 20 | 10 | 112 | 169 | 1 | 30 | 700 |
| | 20 | 20 | 150 | 225 | 1 | 50 | 500 |
| | 20 | 30 | 187 | 281 | 5 | 30 | 140 |
| 600 | 20 | 10 | 79 | 142 | 5 | 50 | 100 |
| | 20 | 20 | 106 | 189 | 10 | 30 | 70 |
| | 20 | 30 | 132 | 236 | 10 | 50 | 50 |
| 900 | 20 | 10 | 65 | 128 | 10 | 80 | 20 |
| | 20 | 20 | 87 | 171 | 50 | 30 | 14 |
| | 20 | 30 | 108 | 213 | 50 | 50 | 10 |

As an example, the thermal temperature may peak at approximately 600K, meaning the greatest number of thermal neutrals in the plasma may have a temperature at 600 K, with less numbers of thermal neutrals having a higher or lower temperature. For 600 K thermal neutrals, a spacing S of 10 mm generates a transit time of 79 μs for Cl and 142 μs for $Cl_2$. A spacing S of 30 mm generates a transit time of 132 μs for Cl and 236 μs for $Cl_2$. For 900 K thermal neutrals, the corresponding transit times for the same spacings are somewhat less, by approximately 20% for Cl and approximately 10% for $Cl_2$. Additionally, the relative composition of Cl and $Cl_2$ neutral species may range from approximately 50% Cl to 70% Cl in some commonly employed plasma conditions. The embodiments are not limited in this context. As such, the neutral chlorine species that may impinge upon a substrate from such a plasma may include significant fractions of both Cl and $Cl_2$.

Table I. also shows the duration of OFF portions of a pulsed ion beam for different combinations of frequency (in kHz) and duty cycle. Notably, the frequency is the inverse of a period of a pulsed ion beam, where the period is the sum of one ON and one OFF portion. As evident from Table I, for pulsed ion beam frequencies of 1 kHz or 5 kHz, the duration of an OFF pulse is 100 μs or greater up to 50% duty cycle. In conventional pulsed ion beam processing, pulsed RF plasmas may often employ such frequencies, especially given the increased cost of power supplies capable of switching at higher frequencies. Additionally, the maximum duty cycle may be maintained at approximately 50% or less to avoid substrate charging, excessive physical sputtering and diminished reactive ion etching that may be encountered when the duty cycle is higher. As a consequence conventional pulsed plasma processing or pulsed ion beam processing may employ conditions where the duration of an OFF pulse exceeds 100 μs, for example. When such pulsed ion beam processing is employed to etch a substrate using chlorine-based plasmas, the duration of the OFF pulse may exceed the transit time of chlorine neutral species such as Cl and $Cl_2$. This situation is especially likely when the duty cycle is relatively lower and the spacing S is relatively lower, such as 10 mm.

In particular, known commercial reactive ion etch chambers may be configured where the plasma is generated within the process chamber that houses a substrate, in close proximity to the substrate. Thus, such a substrate is "immersed" in the plasma where a plasma sheath thickness is as small as 2 mm. For such small sheath thickness, a resultant transit time for certain etchants, such as Cl atomic neutrals is less than 10 μs. Thus, all of the afterglow reactive neutrals that may be present when plasma is pulsed off, will reach the substrate during the OFF portion for pulse frequencies of 10 KHz or less and realistic duty cycles less than 90%.

The present inventors have recognized the usefulness and the possibility of adjusting processing conditions to increase the transit time of neutrals present in a pulsed ion beam, based upon a reactive ion etching plasma. By employing an apparatus such as apparatus 100, as described above, the transit time of neutrals such as Cl radicals or $Cl_2$ radicals, may be adjusted by virtue of the separation between the plasma 112 and substrate 110 provided by the extraction plate 104. In particular, the substrate stage 106 may adjust the spacing S to greater distances than is commonly employed, or is possible in conventional RIE processing, while the duration of the OFF portion of the pulsed ion beam is reduced by adjusting a combination of pulse frequency and duty cycle. Using the example of Table I, in one embodiment, the pulse frequency may be set at 10 KHz, the duty cycle at 30%, and the spacing S at 20 mm. In this example, the duration t of the OFF portion, determined by a combination of duty cycle and frequency, is 70 μs, as shown. For this separation, the transit time for $Cl_2$ thermal neutral species, even at 900 K, is 171 μs, meaning that the large majority of $Cl_2$ thermal neutral species will not traverse from a plasma in a plasma chamber to a substrate during the OFF portion, which portion lasts just 70 μs. The transit time for Cl thermal neutral species, even at 900 K, is 87 μs, meaning that a large fraction of Cl thermal neutral species also will not traverse to the substrate during the OFF portion. In this manner, the large majority of chlorine-based etchant species do not traverse from plasma to substrate during the OFF portion of a pulsed ion beam, reducing the amount of anisotropic etching.

The above example is merely exemplary, and as readily apparent from Table 1, the exact values of pulse frequency, duty cycle, separation S may be adjusted in view of the nature of the etchant species, as well as other considerations, such as optimum duty cycle, maximum pulse frequency available on a power supply providing RF power, and so forth. For example, by virtue of the ability to increase the separation S to distances such as 6 mm, 10 mm, 20 mm, 30 mm, and so forth, the duty cycle may as well as the pulse frequency may be maintained at relatively lower values such as 50% or less and 10 kHz or less, while still providing an OFF portion having a duration less than the transit time.

A value of extraction voltage may vary from approximately 200 V to 1500 V in some embodiments. The embodiments are not limited in this context. At the same time, in some embodiments, the RF power during the ON portion 306 may range from 600 W to 900 W. The embodiments are not limited in this context. In various embodiments, the RF power during the OFF portions may range from 0 W to 400 W. Again, the embodiments are not limited in this context.

Turning now to FIG. 1B, in various embodiments, the extraction aperture 105 may be an elongated aperture that extends along a first direction, such as parallel to the X-axis, as shown in FIG. 1B. For example, the extraction aperture 105 may have a width W ranging between 100 mm and 500 mm in some embodiments and a length L ranging between 3 mm and 30 mm in some embodiments. The embodiments are not limited in this context. This elongated configuration of extraction aperture 105 allows the extraction of an ion beam as a ribbon beam, meaning an ion beam having a cross-section where the beam width is greater than a beam length.

Figure 4A:
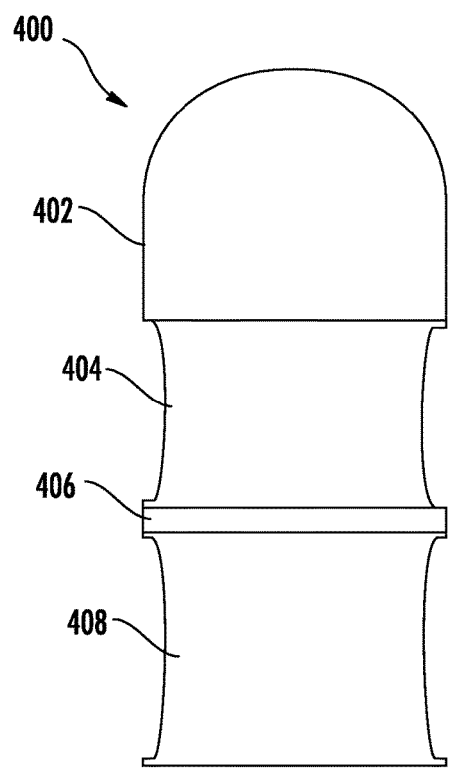
FIG. 4A and FIG. 4B present schematic representation of memory structures formed by reactive ion etching-type processes.
Figure 4B:
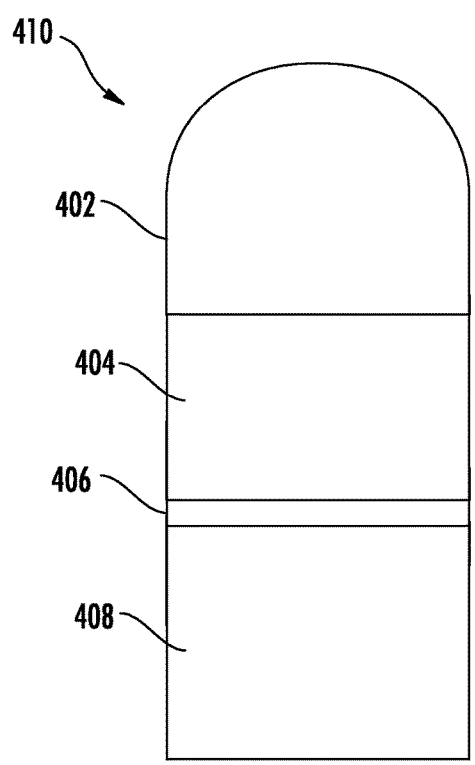

In accordance with various embodiments, the apparatus and techniques disclosed herein may be used to etch complex structures, including multilayer structures that include metallic materials, semiconductor materials, alloys, nitrides, carbon-based materials, as well as oxides and other materials. For formation of small patterned features, the ability to etch a layer or a stack of layers in a highly anisotropic fashion is useful. This anisotropic etching facilitates formation of structures having small critical dimension (CD), small pitch, as well as a large aspect ratio, meaning a large ratio of height to width. FIG. 4A and FIG. 4B present schematic representation of memory structures formed by reactive ion etching-type processes. The results of FIG. 4A and FIG. 4B compare the profiles of structures after etching using a continuous RF power plasma (CW) (FIG. 4A), and after etching using a pulsed ion beam where RF power is synchronized with a pulsed extraction voltage (FIG. 4B), according to embodiments of the disclosure).

In the example of FIG. 4A, a layer stack is etched to form a memory stack 400 used to form a phase change memory. The memory stack 400 is composed of a SiO2 hard mask layer 402, TiN layer 404, carbon layer 406, and phase change layer 408. In this particular example, the phase change layer 408 is formed from a GST material (Ge, As, Si, Te). The initial thickness of the SiO2 layer is approximately 30 nm, the TiN layer 30 nm, the carbon layer 5 nm, and the GST layer 30 nm, for a total thickness of approximately 95 nm. While not shown, the memory stack 400 is arranged in an array where a pitch between adjacent memory stacks, that is, memory stacks 400, along the Y-axis is 40 nm, a width (CD) along the Y-axis is 20 nm. The memory stack 400 is etched under the following conditions: A Cl$_2$ plasma is formed in a plasma chamber using a flow of 2.6 sccm Cl$_2$ flow, 0.25 mTorr pressure; plasma power is operated continuously at 600 W (CW); an extraction voltage is applied as a pulsed DC extraction voltage at 500 V, 20 kHz and 30% duty cycle. A separation S is 18 mm. These operating conditions generate a pulsed ion beam that is extracted from a plasma chamber where the power is maintained at a continuous, and relatively high level, during ON times of the pulsed ion beam as well as OFF times of the pulsed ion beam. As shown, the TiN layer 404 and the phase change layer 408 exhibit scalloping along the sidewalls.

In the example of FIG. 4B, a layer stack is etched to form a memory stack 410 that is composed of the same set of materials as in FIG. 4A. The experimental etch conductions are the same as in FIG. 4A, except the pulsed extraction voltage is operated at 10 kHz, 30% duty cycle. In addition, instead of CM operation, the plasma power is pulsed in synchronization with the extraction voltage, as generally illustrated in FIG. 3A or FIG. 3B (while the frequency and duty cycle are not the same as in FIG. 3A and FIG. 3B). Notably, for the example of FIG. 4B, during an OFF portion of the resulting pulsed ion beam, the RF power in the plasma chamber is reduced to 300 W. As shown in FIG. 4B, the memory stack 410 exhibits vertical sidewalls (parallel to the Z-axis) without scalloping. Further notable is the duration of the OFF portion (70 µs, for 30% duty cycle and 10 kHz). Referring again to Table I., for Cl and Cl$_2$ neutral species having thermal temperatures up to 900 K, the transit times at S=18 mm (approximately the same as for 20 mm shown in Table I) all exceed the duration of the OFF portion (70 µs). This situation means that the extraction voltage to extract the high energy (500 V) pulsed ion beam has turned back on before the Cl and Cl$_2$ thermal neutral species can reach the substrate. This situation results in the improved anisotropic etch profile as shown.

In accordance with various embodiments, the process conditions for operating a pulsed ion beam apparatus, such as apparatus 100 may be adjusted to account for the properties of an etchant recipe to be used for reactive ion etching of a material. In some instances adjusting operating conditions may take place in an automated fashion. For example, a user may input a recipe that indicates the etchant species, where the thermal velocities of the etchant species may be calculated or retrieved to provide a parameter space for pulsed ion beam etching. The parameter space may include a range of pulse frequency, duty cycle and spacing S that may achieve a target condition, such as generating transit times for the etchant species that exceed the duration of the OFF portion of the pulsed ion beam treatment.

Figure 5:
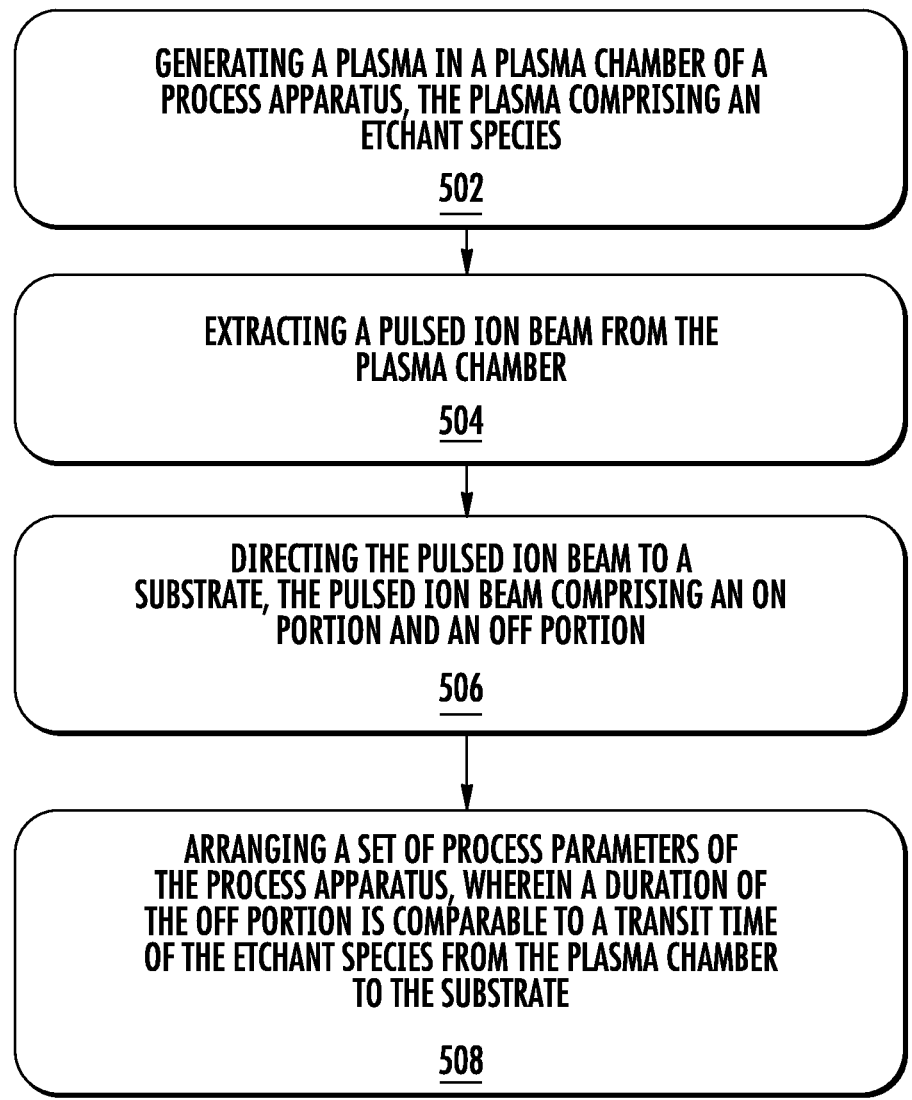
FIG. 5 depicts an exemplary process flow.

FIG. 5 depicts an exemplary process flow 500 according to embodiments of the disclosure. At block 502 the operation is performed of generating a plasma in a plasma chamber of a process apparatus, the plasma comprising an etchant species. At block 504, the operation is performed extracting a pulsed ion beam from the plasma chamber. At block 506 the operation is performed of directing the pulsed ion beam to a substrate, the pulsed ion beam comprising an ON portion and an OFF portion. At block 508, the operation is performed of arranging a set of process parameters of the process apparatus, wherein a duration of the OFF portion is comparable to a transit time of the etchant species from the plasma chamber to the substrate.

The present embodiments provide various advantages over conventional processing to etch features in a substrate. One advantage lies in the ability to independently adjust the separation between a plasma used to generate a pulsed reactive ion etching of a substrate, meaning the edge of a plasma sheath, and a substrate being etched. This independent adjustment allows the transit time of isotropic etchant species to be increased to reduce their effect on a feature being etched. Another advantage is the flexibility in adjusting the duration of an OFF portion of a pulsed ion beam, using independent parameters, such as pulse frequency and duty cycle.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
generating a plasma in a plasma chamber, the plasma comprising an etchant species; and
extracting a pulsed ion beam from the plasma chamber and directing the pulsed ion beam to a substrate, the pulsed ion beam comprising an ON portion and an OFF portion,
wherein during the OFF portion the substrate is not biased with respect to the plasma chamber, and
wherein a duration of the OFF portion is less than a transit time of the etchant species from the plasma chamber to the substrate.

2. The method of claim 1, wherein the plasma is generated by providing RF power to the plasma chamber, the method further comprising adjusting a level of RF power of the plasma in concert with the pulsed ion beam, wherein the plasma comprises a first RF power level during the ON portion and a second RF power level during the OFF portion, wherein the first RF power level is higher than the second RF power level.

3. The method of claim 2, wherein the second RF power level is adequate to sustain the plasma.

4. The method of claim 1, wherein the etchant species is a thermal neutral species.

5. The method of claim 1, wherein the etchant species comprises at least one of chlorine neutrals and chlorine ions.

6. The method of claim 1, comprising:
setting a separation between the plasma chamber and the substrate, wherein the transit time of the etchant species is proportional to the separation; and
setting the duration of the OFF portion to be less than the transit time.

7. The method of claim 6, wherein the separation is at least 6 mm.

8. The method of claim 1, wherein a duty cycle of the pulsed ion beam is 50% or less.

9. The method of claim 1, wherein a frequency of the pulsed ion beam is 10 kHz or less.

10. The method of claim 1, wherein the extracting the pulsed ion beam comprises:
providing an extraction plate having at least one extraction aperture, disposed between the plasma chamber and the substrate; and
generating a pulsed extraction voltage between the substrate and the plasma chamber.

11. The method of claim 10, wherein the pulsed ion beam comprises ions having a trajectory that extends along a perpendicular to a plane of the substrate.

12. A method of etching a substrate to form a surface feature, comprising:
providing a chlorine-containing gas to a plasma chamber;
generating a plasma in the plasma chamber, the plasma comprising an etchant species derived from the chlorine-containing gas;
extracting a pulsed ion beam from the plasma chamber and directing the pulsed ion beam to the substrate, the pulsed ion beam comprising an ON portion and an OFF portion; and
pulsing a level of RF power of the plasma in concert with the pulsed ion beam, wherein the plasma comprises a first RF power level during the ON portion and a second RF power level during the OFF portion, wherein the first RF power level is higher than the second RF power level,
wherein a duration of the OFF portion is less than a transit time of the etchant species from the plasma chamber to the substrate.

13. The method of claim 12, wherein the etchant species comprises chlorine neutrals.

14. The method of claim 12, comprising:
setting a separation between the plasma chamber and the substrate, wherein the transit time of the etchant species is proportional to the separation; and
setting the duration of the OFF portion to be less than the transit time.

15. The method of claim 14, wherein the separation is at least 6 mm, wherein a duty cycle of the pulsed ion beam is 50% or less, and wherein a frequency of the pulsed ion beam is 10 kHz or less.

16. The method of claim 12, wherein during the OFF portion the substrate is not biased with respect to the plasma chamber.

17. The method of claim 12, wherein the surface feature comprises a plurality of layers forming a phase change memory.

* * * * *